(12) United States Patent
Ato

(10) Patent No.: US 12,254,947 B2
(45) Date of Patent: Mar. 18, 2025

(54) SEMICONDUCTOR MEMORIES INCLUDING EDGE MATS HAVING FOLDED DIGIT LINES

(71) Applicant: MICRON TECHNOLOGY, INC., Boise, ID (US)

(72) Inventor: Hirokazu Ato, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 210 days.

(21) Appl. No.: 17/893,966

(22) Filed: Aug. 23, 2022

(65) Prior Publication Data

US 2024/0071426 A1    Feb. 29, 2024

(51) Int. Cl.
| | | |
|---|---|---|
| G11C 5/06 | (2006.01) | |
| H01L 23/522 | (2006.01) | |
| H01L 23/528 | (2006.01) | |
| H01L 23/532 | (2006.01) | |

(52) U.S. Cl.
CPC .......... *G11C 5/063* (2013.01); *H01L 23/5223* (2013.01); *H01L 23/528* (2013.01); *H01L 23/53271* (2013.01)

(58) Field of Classification Search
CPC ....... G11C 5/063; G11C 7/18; H01L 23/5223; H01L 23/53271
See application file for complete search history.

(56) References Cited

U.S. PATENT DOCUMENTS

| | | | | |
|---|---|---|---|---|
| 5,864,181 A | * | 1/1999 | Keeth | ................. H01L 23/5225 365/69 |
| 6,639,822 B2 | * | 10/2003 | Fujisawa | ................. H10B 12/48 257/E27.097 |
| 2014/0003113 A1 | * | 1/2014 | Seno | ...................... G11C 5/025 365/51 |
| 2023/0186969 A1 | * | 6/2023 | Cho | ........................ G06F 12/06 711/106 |

* cited by examiner

*Primary Examiner* — Han Yang
(74) *Attorney, Agent, or Firm* — Dorsey & Whitney LLP

(57) ABSTRACT

Apparatuses and methods including folded digit lines are disclosed. An example apparatus includes a first digit line portion extending in a first direction, a second digit line portion extending in the first direction, and a third digit line portion between the first and second digit line portions and extending in the first direction. A folded portion is coupled to the first and second digit line portions, and extends in a second direction and traverses the third digit line portion.

19 Claims, 9 Drawing Sheets

US 12,254,947 B2

SEMICONDUCTOR MEMORIES INCLUDING EDGE MATS HAVING FOLDED DIGIT LINES

BACKGROUND

Semiconductor memories include a memory array having memory banks of memory cells. The memory banks may be accessed to read data from and write data to the memory cells. The memory banks may be arranged as mats of memory cells. As memory capacities increase while the size of memories decrease, memory density is an important consideration when laying out a memory array. For example, memory array layouts that include smaller memory mats of memory cells may be desirable.

The memory banks may include normal mats of memory cells and edge mats of memory cells. The edge mats are typically smaller than the normal mats because the edge mats include digit lines that are folded. A folded digit line may provide a balanced capacitive load with a digit line of a normal mat, but allow for a smaller mat size. However, conventional folded digit lines of edge mats have a layout that may prevent detection of digit line defects, such as short circuits, and have an arrangement that results in an edge mat size that is larger than desirable.

DETAILED DESCRIPTION

Various embodiments of the present disclosure will be explained below in detail with reference to the accompanying drawings. The following detailed description refers to the accompanying drawings that show, by way of illustration, specific aspects in which embodiments of the present disclosure may be practiced. These embodiments are described in sufficient detail to enable those skilled in the art to practice the embodiments of present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
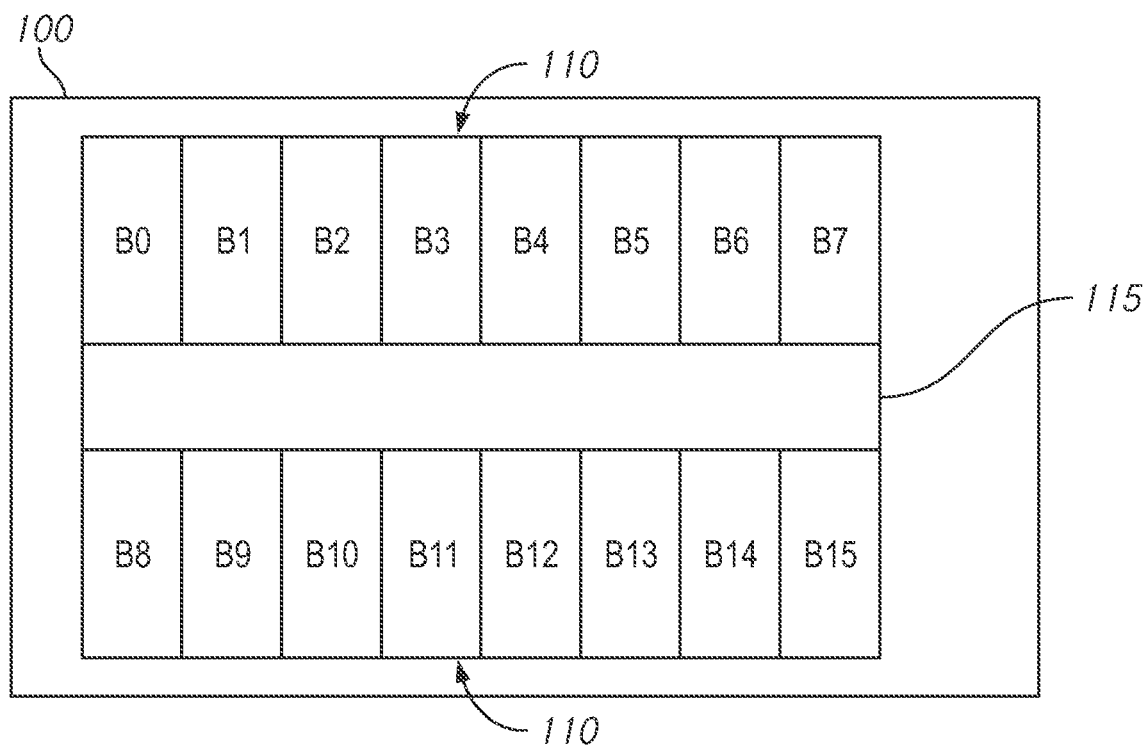
FIG. 1 is a block diagram of a memory device according to an embodiment of the disclosure.

FIG. 1 is a block diagram of a memory device 100 according to an embodiment of the disclosure. The memory device 100 includes a memory array 110 that include memory banks BANK0-BANK15 of memory cells. The memory banks may be accessed to read data from and write data to the memory cells. Between the memory regions 110 is a periphery region 115. Various memory circuits used for memory operations such as accessing the memory array 110 are included in the periphery region 115. The memory banks BANK0-BANK15 include mats of memory cells and further include sense amplifiers arranged in sense amplifier regions between the mats of memory cells.

Figure 2:
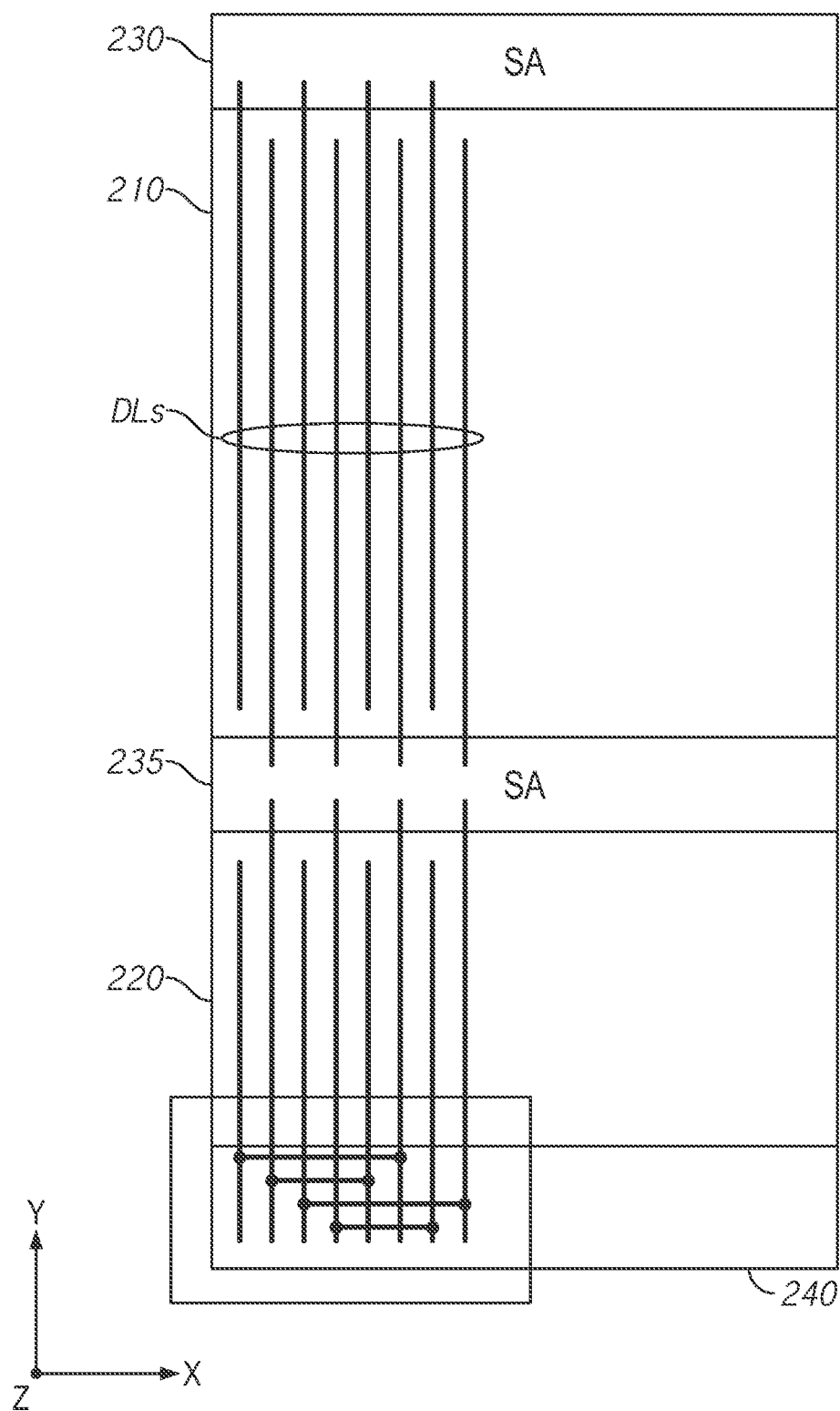
FIG. 2 is a diagram of a portion of a memory array according to an embodiment of the disclosure.

FIG. 2 is a diagram of a portion of a memory array 200 according to an embodiment of the disclosure. In some embodiments of the disclosure, the portion of the memory array 200 is included in the memory array 110 of FIG. 1.

The portion of the memory array 200 includes a normal mat 210 and an edge mat 220. Sense amplifier regions 230 and 235 are also included in the portion of the memory array 200 shown in FIG. 2. The normal mat 210 includes digit lines DL that extend in the direction Y. Each of the digit lines is coupled to a sense amplifier included in one of the sense amplifier regions 230 or 235. The normal mat 210 further includes word lines WL (not shown in FIG. 2) that extend in a direction X. Memory cells are included at the intersections of the digit lines DL and the word lines WL.

The edge mat 220 includes folded digit lines DLE that each include a digit line portion that extends in the direction Y from the sense amplifier region 235, a folded portion that extends in the direction X in an edge region 240, and a digit line portion that extends in the direction Y from the edge region 240. As will be described in more detail below, the folded portion of a digit line DLE included in the edge mat 220 traverses a digit line portion of at least one different digit line DLE. The edge mat 220 further includes word lines WL (not shown in FIG. 2) that extend in a direction X. Memory cells are included at the intersections of the digit lines DLE and the word lines WL. The digit line portions of a digit line DLE included in the edge mat 220 are shorter (e.g., shorter physical length) than a digit line DL included in the normal mat 210. A number of word lines WL included in the edge mat 220 is less than a number of word lines WL included in the normal mat 210. As a result, the edge mat 220 may be smaller than the normal mat 210.

A sense amplifier included in the sense amplifier region 235 is coupled to a digit line DL included in the normal mat 210 and also coupled to a digit line DLE included in the edge mat 220. Although the number of word lines WL included in the edge mat 220 is less than the number of word lines WL included in the normal mat 210, the capacitive load of the digit line DL and the digit line DLE are balanced. The digit lines DLE included in the edge mat 220 are folded as previously described, and provide capacitance effectively equal to the capacitance of the digit lines DL included in the normal mat 210.

Figure 3:
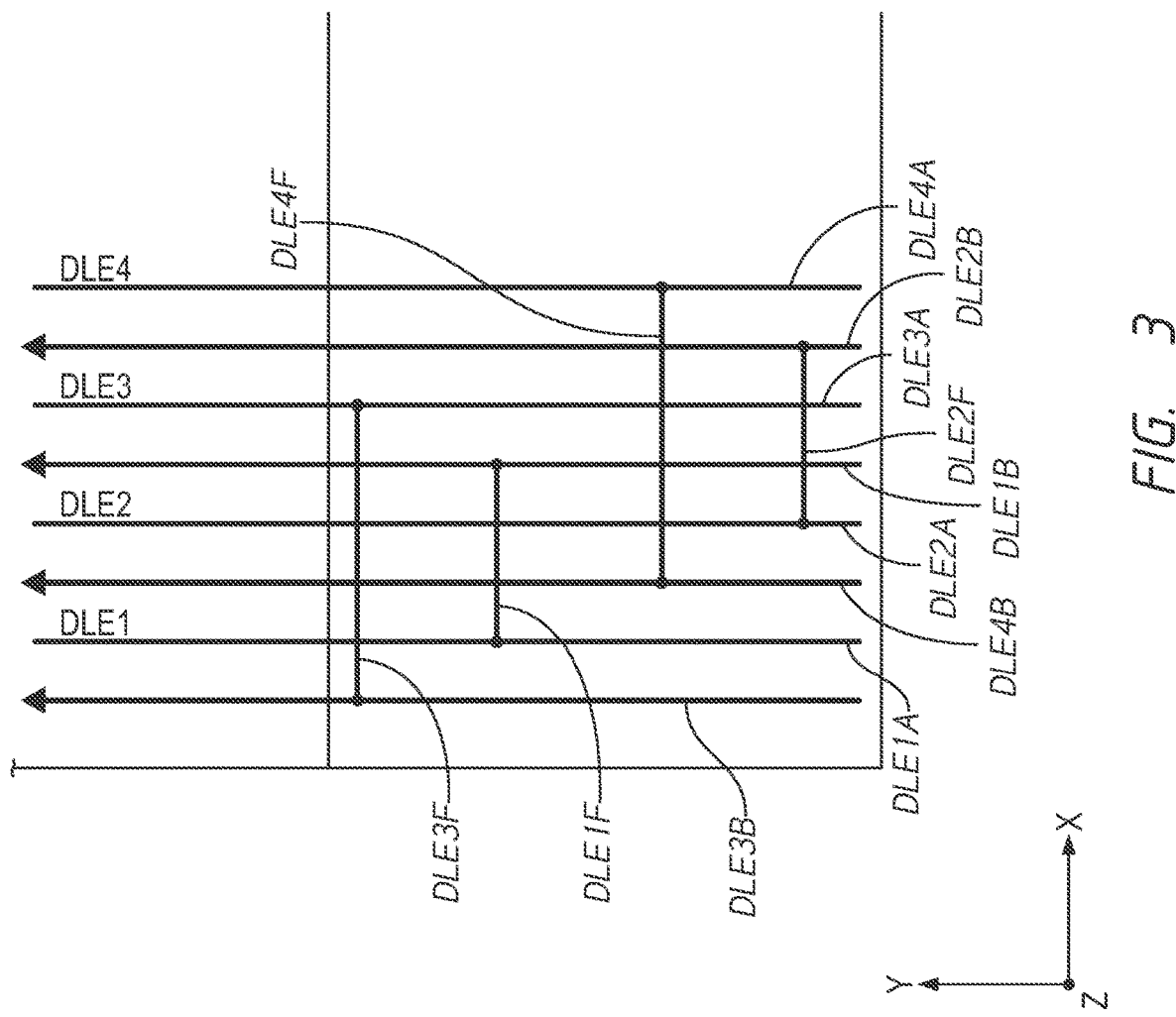
FIG. 3 is a diagram for folded portions of digit lines according to an embodiment of the disclosure.

FIG. 3 is a diagram for folded portions of digit lines according to an embodiment of the disclosure. The folded portions of the digit lines may be included in an edge region adjacent the edge mat. In some embodiments, the folded portions of the digit lines shown in FIG. 3 may be included in the edge mat 220 of FIG. 2. The folded portions of a digit line traverse at least one digit line portion of one or more different digit lines. As a result, two digit line portions of a same digit line are not adjacent. The folded portions of the digit lines may be included in an edge region adjacent the edge mat in some embodiments.

Digit lines DLE1, DLE2, DLE3, and DLE4 are shown in FIG. 3. Each of the digit lines includes digit line portions A and B that extend into the edge mat in a direction Y from the edge region. Each of the digit lines further includes a folded portion F that couples the digit line portions A and B of the same digit line. The folded portion F extends in a direction X. For example, the digit line DLE1 includes a digit line portion DLE1A and a digit line portion DLE1B, and also includes a folded portion DLE1F coupled to the digit line portions DLE1A and DLE1B. As a result, the digit line DLE1 is electrically continuous through digit line portion DLE1A, folded portion DLE1F, and digit line portion DLE1B. Similarly, the digit line DLE2 includes a digit line portion DLE2A and a digit line portion DLE2B, and also includes a folded portion DLE2F; the digit line DLE3 includes a digit line portion DLE3A and a digit line portion DLE3B, and also includes a folded portion DLE3F; and the digit line DLE4 includes a digit line portion DLE4A and a digit line portion DLE4B, and also includes a folded portion DLE4F. Although the folded portions F in the embodiment shown in FIG. 3 extend in a direction X, in some embodiments, the folded portions F may extend in a direction other than X and couple together the digit line portions of a digit line DLE.

The folded portions of each of the digit lines DLE1, DLE2, DLE3, and DLE4 traverse at least one digit line portion of another digit line. As a result, digit line portions of a same digit line are not adjacent and are separated by at least one digit line portion of a different folded digit line. For example, with reference to the example of FIG. 3, the folded portion DLE1F traverses digit line portion DLE2A of digit line DLE2 and digit line portion DLE4B of digit line DLE4. As a result, the digit line portion DLE1A is not adjacent to digit line portion DLE1B. The digit line portion DLE1A is adjacent to digit line portions DLE3B and DLE4B, and digit line portion DLE1B is adjacent digit line portions DLE2A and DLE3A. Two digit line portions (e.g., DLE2A and DLE4B) of different digit lines are between the digit line portions DLE1A and DLE1B of the digit line DLE1, and thus, the digit line portions DLE1A and DLE1B are separated by the digit line portions of digit lines DLE2 and DLE4. The digit line DLE2 is similar to the digit line DLE1 in that the folded portion DLE2F traverses two digit line portions (e.g., DLE1B and DLE3A), and thus, two digit line portions of different digit lines separate the digit line portions DLE2A and DLE2B of the digit line DLE2.

In another example, the folded portion DLE3F traverses digit line portions DLE1B, DLE2A, DLE4B, and DLE1A of digit lines DLE1, DLE2, DLE4, and DLE1, respectively. As a result, the digit line portion DLE3A is not adjacent to digit line portion DLE3B. Four digit line portions (e.g., DLE1B, DLE2A, DLE4B, and DLE1A) of different digit lines are between the digit line portions DLE3A and DLE3B of the digit line DLE3, and thus, the digit line portions DLE3A and DLE3B are separated by the digit line portions of digit lines DLE1, DLE2, and DLE4. The digit line DLE4 is similar to the digit line DLE3 in that the folded portion DLE4F traverses four digit line portions (e.g., DLE2B, DLE3A, DLE1B, and DLE2A), and thus, four digit line portions of different digit lines separate the digit line portions DLE4A and DLE4B of the digit line DLE4.

A folded digit line having digit line portions not being adjacent, for example, having digit line portions of at least one different digit line between digit line portions of the same folded digit line, may provide higher capacitance compared to conventional folded digit lines having adjacent digit line portions (i.e., no digit line portions between the digit line portions of the same folded digit line). By having the digit line portion of at least one different digit line between digit line portions of the same folded digit line, the digit line portions will be capacitively coupled to digit line portions of different digit lines, instead of a digit line portion of the same folded digit line. As a result, digit line portions of a folded digit line having a folded portion that traverses the digit line portion of at least one different digit line may be relatively shorter compared to the digit line portions of conventional folded digit lines of an edge mat. The shorter digit line portions may allow for a smaller edge mat. With a folded digit line having digit line portions that are not adjacent, short circuit defects between adjacent folded digit lines may be detected because adjacent digit line portions are from different folded digit lines. As a result, defect detection may be improved compared to edge mats including conventional folded digit lines having adjacent digit line portions.

Figure 4:
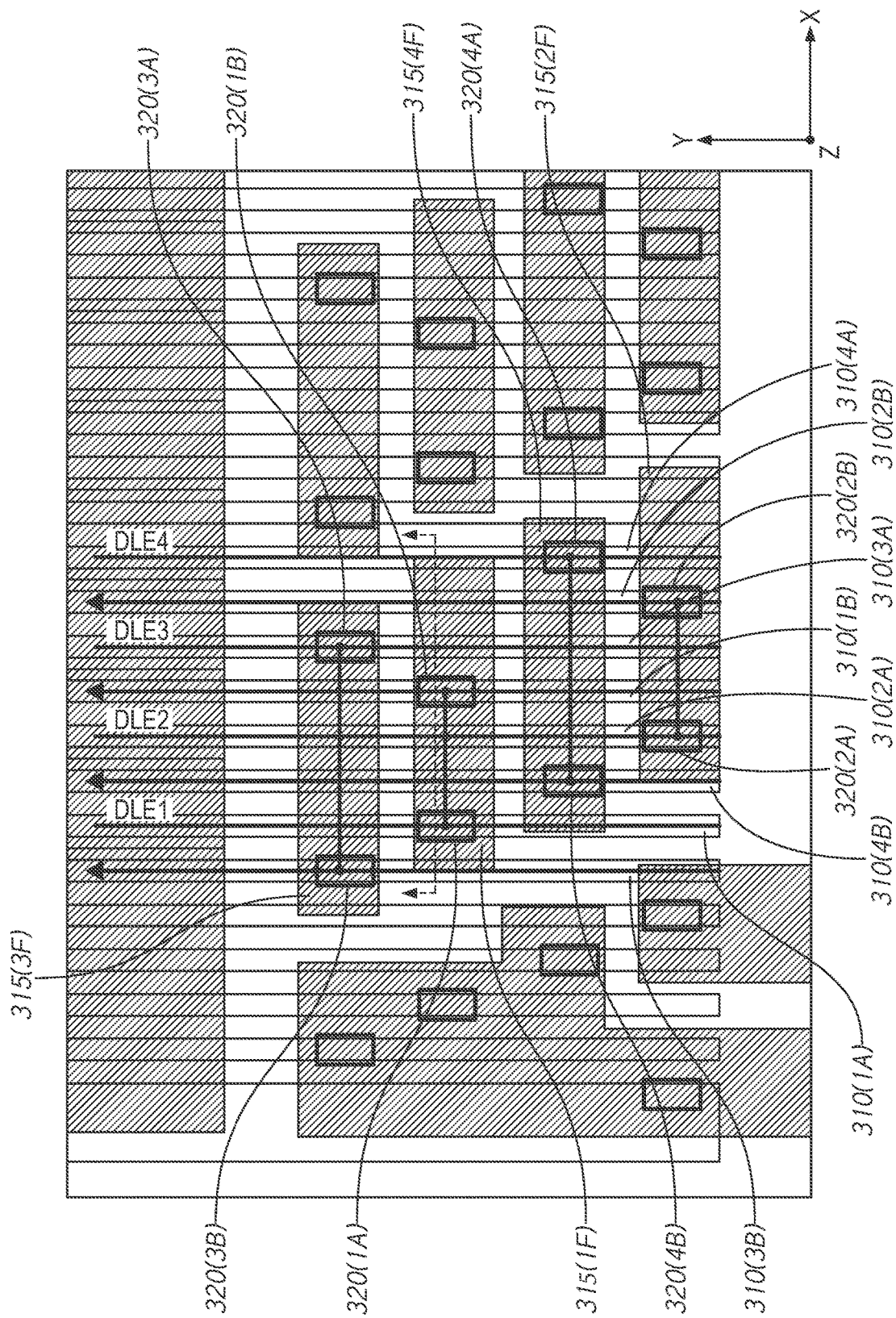
FIG. 4 is a layout diagram for folded portions of digit lines according to an embodiment of the disclosure.

FIG. 4 is a layout diagram for folded portions of digit lines according to an embodiment of the disclosure. The layout for digit lines DLE1, DLE2, DLE3, and DLE4 of FIG. 3 are shown in FIG. 4. In the example of FIG. 4, the digit line portions of the digit lines DLE1, DLE2, DLE3, and DLE4 are provided by conductive lines 310 that extend in the direction Y. The conductive lines 310 include conductive material. In some embodiments, the conductive lines 310 include doped polysilicon. The conductive lines 310 may be formed on a surface of a substrate. The conductive lines 310 may alternatively be formed in the substrate. The folded portions of the digit lines DLE1, DLE2, DLE3, and DLE4 are provided by conductive interconnects 315 and contacts 320. Each contact 320 includes a conductive material and couples a respective signal line to a conductive interconnect 315 on a different layer of the structure. The conductive interconnects 315 extend in the direction X, and extend over one or more conductive lines 310 of one or more different digit lines. The conductive interconnects 315 have a first dimension in the direction X that is greater than a second dimension in the direction Y.

In some embodiments of the disclosure, the conductive interconnects 315 are formed from a metal material, for example, tungsten. Other conductive materials may be used for the conductive interconnects 315 as well. The conductive interconnects 315 may be formed from a conductive material deposited on an insulating layer, and the contacts 320 penetrate the insulating layer to couple to a respective conductive line 310. In some embodiments of the disclosure, the conductive interconnect 315 may be formed from a first metal layer of a semiconductor structure (e.g., M1 metal layer). Known and later developed fabrication processes may be used to form the conductive lines 310, contacts 320, and conductive interconnects 315, as well as other semiconductor structures and/or layers to provide the layout for folded portions of digit lines. In some embodiments of the disclosure, the conductive interconnects 315 for each of the digit lines DLE1, DLE2, DLE3, and DLE4 have the same dimensions. For example, the conductive interconnects 315 for the digit lines DLE1, DLE2, DLE3, and DLE4 may have the same lengths in the direction X and the same widths in the direction Y.

Each digit line DLE1, DLE2, DLE3, and DLE4 of the example of FIG. 4 includes first and second conductive lines 310, first and second contacts 320, and a conductive interconnect 315. As a result, a digit line is electrically continuous from one of the conductive lines 310, through the conductive interconnect 315 and contacts 320, to the other conductive line 310. The digit line DLE1 includes conductive lines 310(1A) and 310(1B), contacts 320(1A) and 320(1B), and conductive interconnect 315(1F). Similarly, the digit line DLE2 includes conductive lines 310(2A) and 310(2B), contacts 320(2A) and 320(2B), and conductive interconnect 315(2F). Also likewise, the digit line DLE3 includes conductive lines 310(3A) and 310(3B), contacts 320(3A) and 320(3B), and conductive interconnect 315(3F); and the digit line DLE4 includes conductive lines 310(4A) and 310(4B), contacts 320(4A) and 320(4B), and conductive interconnect 315(4F).

Figure 5:
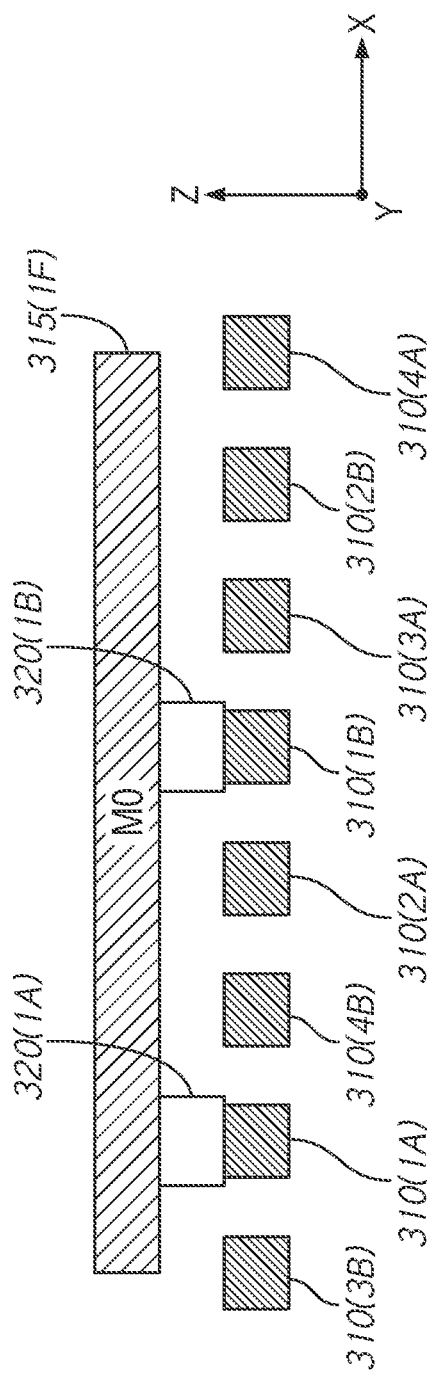
FIG. 5 is a simplified cross-sectional diagram for a digit line of FIG. 4 according to an embodiment of the disclosure.

FIG. 5 is a simplified cross-sectional diagram for a digit line of FIG. 4 according to an embodiment of the disclosure. In particular, FIG. 5 is the cross-sectional diagram for the digit line DLE1 at the cutting plane line shown in FIG. 4. The cutting plane line is along the direction X and the resulting cross-sectional diagram includes, among other things, the conductive lines 310(1A) and 310(1B), the contacts 320(1A) and 320(1B), and the conductive interconnect 315(1F).

The conductive lines 310(1A) and 310(1B) of the digit DLE1 line are spaced apart laterally, with one or more conductive lines 310 of one or more different digit lines between them. In particular, the two conductive lines 310 (4B) and 310(2A) of digit lines DLE4 and DLE2, respectively, are between the conductive lines 310(1A) and 310 (1B) of the digit line DLE1. The contact 320(1A) is positioned over and coupled to the conductive line 310(1A) along the direction Z, and the contact 320(1B) is positioned over and coupled to the conductive line 310(1B) along direction Z. The conductive interconnect 315(1F) is positioned over and is coupled to the contacts 320(1A) and 320(1B). A continuously conductive digit line DLE1 is provided by the conductive line 310(1A), contact 320(1A), conductive interconnect 315(1F), contact 320(1B), and the conductive line 310(1B). The conductive interconnect 315 (1F) extends and crosses over the two conductive lines 310(4B) and 310(2A) of the different digit lines DLE4 and DLE2, all respectively. As a result, the conductive lines 310(1A) and 310(1B) of the digit line DLE1 are not adjacent to each other, and have two conductive lines 310(4B) and 310(2A) of the different digit lines DLE4 and DLE2 between them along the direction X.

As previously described, a folded digit line having digit line portions not being adjacent, may provide higher capacitance compared to conventional folded digit lines having adjacent digit line portions. As a result, digit line portions of a folded digit line having a folded portion that traverses the digit line portion of at least one different digit line may be relatively shorter compared to the digit line portions of conventional folded digit lines of an edge mat, and consequently, the shorter digit line portions may allow for a smaller edge mat. Also with a folded digit line having digit line portions that are not adjacent, defect detection may be improved compared to edge mats including conventional folded digit lines because short circuit defects between adjacent folded digit lines may be detected because adjacent digit line portions are from different folded digit lines.

Although not shown, a cross-sectional view for the digit line DLE2 through the contacts 320(2A) and 320(2B) is similar to the cross-sectional view for the digit line DLE1 shown in FIG. 5. That is, the conductive lines 310(2A) and 310(2B) would be coupled together through contacts 320 (2A) and 320(2B), and the conductive interconnect 315(2F). The contacts 320(2A) and 320(2B) are positioned over and coupled to the conductive lines 310(2A) and 310(2B) along the direction Z, respectively, and the conductive interconnect 315(2F) is positioned over and coupled to the contacts 320(2A) and 320(2B). The conductive interconnect 315(2F) extends and crosses over two conductive lines 310(1B) and 310(3A) of the different digit lines DLE1 and DLE3, respectively, with the two conductive lines 310(1B) and 310(3A) positioned between the conductive lines 310(2A) and 310 (2B) of digit line DLE2 along the direction X.

Although not shown, a cross-sectional view for the digit line DLE3 through the contacts 320(3A) and 320(3B) is also similar to the cross-sectional view for the digit line DLE1 shown in FIG. 5. That is, the conductive lines 310(3A) and 310(3B) would be coupled together through contacts 320 (3A) and 320(3B), and the conductive interconnect 315(3F). The contacts 320(3A) and 320(3B) are positioned over and coupled to the conductive lines 310(3A) and 310(3B) along the direction Z, respectively, and the conductive interconnect 315(3F) is positioned over and coupled to the contacts 320(3A) and 320(3B). However, unlike the digit line DLE1, the conductive interconnect 315(3F) of digit line DLE3 extends and crosses over four conductive lines 310(1B), 310(2A), 310(4B), and 310(1A) of the different digit lines DLE1, DLE2, and DLE4, with the four conductive lines 310(1B), 310(2A), 310(4B), and 310(1A) positioned between the conductive lines 310(3A) and 310(3B) of digit line DLE3 along the direction X.

Although not shown, a cross-sectional view for the digit line DLE4 through the contacts 320(4A) and 320(4B) is also similar to the cross-sectional view for the digit line DLE1 shown in FIG. 5. That is, the conductive lines 310(4A) and 310(4B) would be coupled together through contacts 320 (4A) and 320(4B), and the conductive interconnect 315(4F). The contacts 320(4A) and 320(4B) are positioned over and coupled to the conductive lines 310(4A) and 310(4B) along the direction Z, respectively, and the conductive interconnect 315(4F) is positioned over and coupled to the contacts 320(4A) and 320(4B). However, unlike the digit line DLE1, the conductive interconnect 315(4F) of digit line DLE4 extends and crosses over four conductive lines 310(2B), 310(3A), 310(1B), and 310(2A) of the different digit lines DLE2, DLE3, and DLE1, with the four conductive lines 310(2B), 310(3A), 310(1B), and 310(2A) positioned between the conductive lines 310(3A) and 310(3B) of digit line DLE3 along the direction X.

Figure 6:
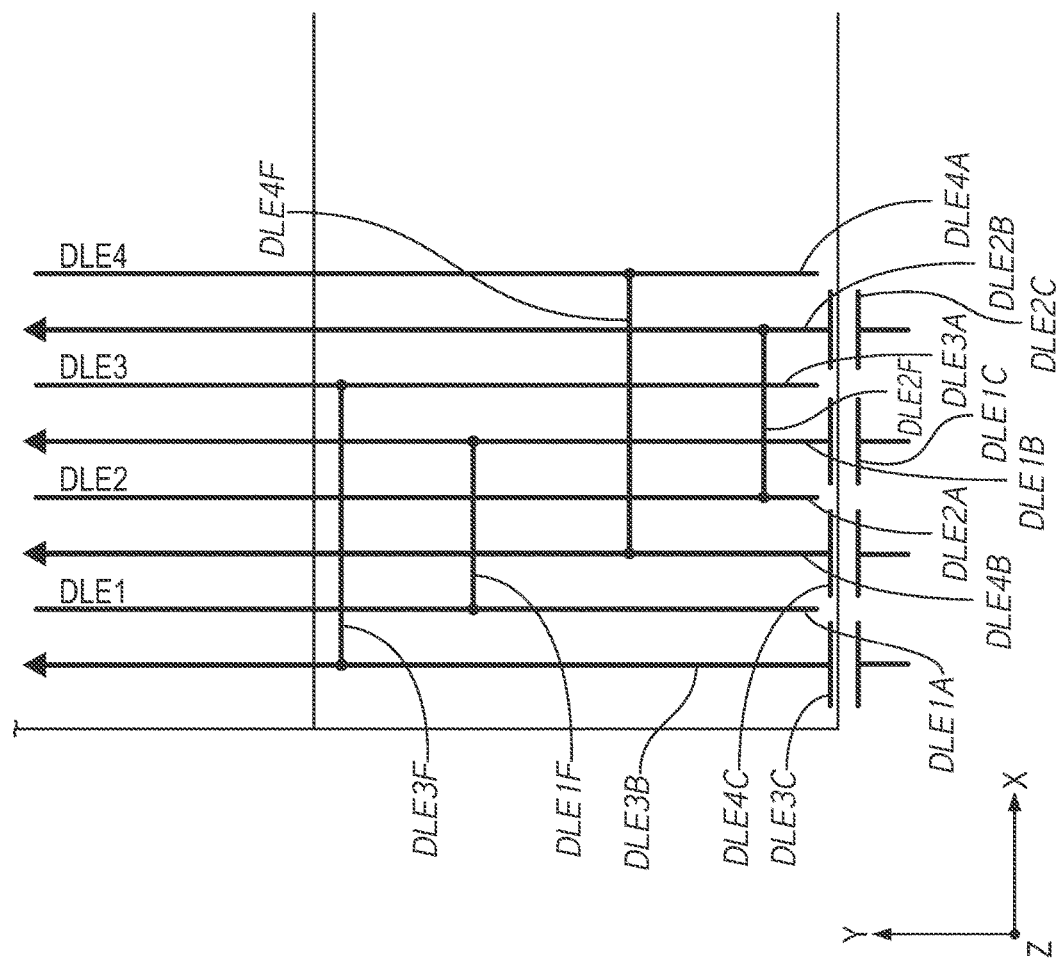
FIG. 6 is a diagram for folded portions of digit lines according to an embodiment of the disclosure.

FIG. 6 is a diagram for folded portions of digit lines according to an embodiment of the disclosure. The folded portions of the digit lines may be included in an edge region adjacent the edge mat. In some embodiments, the folded portions of the digit lines shown in FIG. 6 may be included in the edge mat 220 of FIG. 2. The folded portions of a digit line traverse at least one digit line portion of one or more different digit lines. As a result, two digit line portions of a same digit line are not adjacent.

Digit lines DLE1, DLE2, DLE3, and DLE4 are shown in FIG. 6. The digit lines DLE1, DLE2, DLE3, and DLE4 of FIG. 6 are similar to the digit lines DLE1, DLE2, DLE3, and DLE4 of FIG. 3. However, each of the digit lines DLE1, DLE2, DLE3, and DLE4 of FIG. 6 include additional respective capacitance that increases the capacitance of the respective digit line. For example, the digit line DLE1 includes a digit line wiring extension, represented by wiring capacitance DLE1C, that increases the capacitance of the digit line DLE1. Similarly, the digit line DLE2 includes a digit line wiring extension, represented by wiring capacitance DLE2C, that increases the capacitance of the digit line DLE2; the digit line DLE3 includes a digit line wiring extension, represented by wiring capacitance DLE3C, that increases the capacitance of the digit line DLE3; the digit line DLE4 includes a digit line wiring extension, represented by wiring capacitance DLE4C, that increases the capacitance of the digit line DLE4.

Adding capacitance, such as from wiring capacitance of a digit line wiring extension, may allow for shorter digit line portions of the folded digit lines of an edge mat compared to folded digit lines that are not coupled to additional capacitance. The shorter digit line portions may result in edge mats having a relatively smaller size.

As with the digit lines shown in FIG. 3, each the digit lines DLE1, DLE2, DLE3, and DLE4 of FIG. 6 includes digit line portions A and B that extend into the edge mat from the edge region in a direction Y. Each of the digit lines further includes a folded portion F that couples the digit line portions A and B of the same digit line. The folded portion F extends in a direction X. As shown in the example of FIG. 6, the digit line DLE1 includes a digit line portion DLE1A and a digit line portion DLE1B, and also includes a folded portion DLE1F coupled to the digit line portions DLE1A and DLE1B. As a result, the digit line DLE1 is electrically continuous through digit line portion DLE1A, folded portion DLE1F, and digit line portion DLElB. Similarly, the digit line DLE2 includes a digit line portion DLE2A and a digit line portion DLE2B, and also includes a folded portion DLE2F; the digit line DLE3 includes a digit line portion DLE3A and a digit line portion DLE3B, and also includes a folded portion DLE3F; and the digit line DLE4 includes a digit line portion DLE4A and a digit line portion DLE4B, and also includes a folded portion DLE4F. Although the folded portions F in the embodiment shown in FIG. 6 extend in a direction X, in some embodiments, the folded portions F may extend in a direction other than X and couple together the digit line portions of a digit line DLE.

The folded portions of each of the digit lines DLE1, DLE2, DLE3, and DLE4 of FIG. 6 traverse at least one digit line portion of another digit line. As a result, digit line portions of a same digit line are not adjacent. For example, the folded portion DLE1F traverses digit line portion DLE2A of digit line DLE2 and digit line portion DLE4B of digit line DLE4. As a result, the digit line portion DLE1A is not adjacent to digit line portion DLE1B. The digit line portion DLE1A is adjacent to digit line portions DLE3B and DLE4B, and digit line portion DLE1B is adjacent digit line portions DLE2A and DLE3A. Two digit line portions (e.g., DLE2A and DLE4B) of different digit lines are between the digit line portions DLE1A and DLE1B of the digit line DLE1. The digit line DLE2 is similar to the digit line DLE1 in that the folded portion DLE2F traverses two digit line portions (e.g., DLE1B and DLE3A), and thus, two digit line portions of different digit lines are between the digit line portions DLE2A and DLE2B of the digit line DLE2.

In another example, the folded portion DLE3F traverses digit line portions DLE1B, DLE2A, DLE4B, and DLE1A of digit lines DLE1, DLE2, DLE4, and DLE1, respectively. As a result, the digit line portion DLE3A is not adjacent to digit line portion DLE3B. Four digit line portions (e.g., DLE1B, DLE2A, DLE4B, and DLE1A) of different digit lines are between the digit line portions DLE3A and DLE3B of the digit line DLE3. The digit line DLE4 is similar to the digit line DLE3 in that the folded portion DLE4F traverses four digit line portions (e.g., DLE2B, DLE3A, DLE1B, and DLE2A), and thus, four digit line portions of different digit lines are between the digit line portions DLE4A and DLE4B of the digit line DLE4.

As previously described, the digit lines DLE1, DLE2, DLE3, and DLE4 include additional wiring capacitance DLE1C, DLE2C, DLE3C, and DLE4C in the example of FIG. 6.

Figure 7:
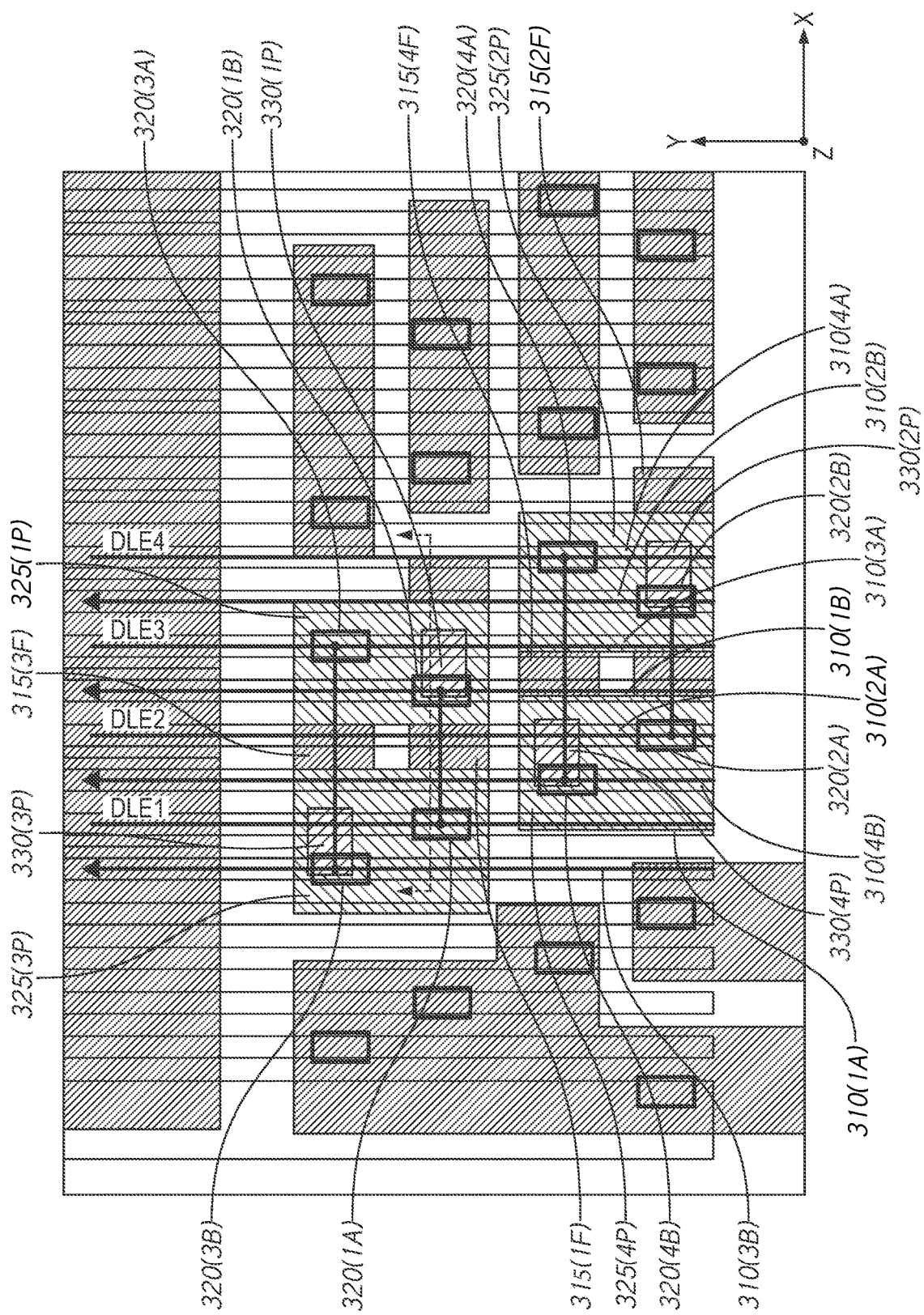
FIG. 7 is a layout diagram for folded portions of digit lines according to an embodiment of the disclosure.

FIG. 7 is a layout diagram for folded portions of digit lines according to an embodiment of the disclosure. The layout for digit lines DLE1, DLE2, DLE3, and DLE4 of FIG. 6 are shown in FIG. 7. The layout for the folded portions of the digit lines of FIG. 7 is similar to the layout for the folded portions of the digit lines of FIG. 4 previously described. For example, the digit line portions of the digit lines DLE1, DLE2, DLE3, and DLE4 of FIG. 7 are provided by conductive lines 310 that extend along the direction Y. The conductive lines 310 include conductive material. In some embodiments, the conductive lines 310 include doped polysilicon. The conductive lines 310 may be formed on a surface of a substrate. The conductive lines 310 may alternatively be formed in the substrate. The folded portions of the digit lines DLE1, DLE2, DLE3, and DLE4 are provided by conductive interconnects 315 and contacts 320. Each contact 320 includes a conductive material and couples a respective signal line to a conductive interconnect 315. The conductive interconnects 315 extend along in the direction X, and extend over one or more conductive lines 310 of one or more different digit lines. In some embodiments of the disclosure, the conductive interconnects 315 are formed from a metal material, for example, tungsten. Other conductive materials may be used for the conductive interconnects 315 as well.

Unlike the layout for the folded portions of the digit lines of FIG. 4, the layout for the folded portions of the digit lines for the example of FIG. 7 includes wiring extensions provided by conductive wiring layers 325 and wiring contacts 330. For example, the digit line DLE1 includes a wiring extension provided by wiring layer 325(1P) and wiring contact 330(1P); the digit line DLE2 includes a wiring extension provided by wiring layer 325(2P) and wiring contact 330(2P); the digit line DLE3 includes a wiring extension provided by wiring layer 325(3P) and wiring contact 330(3P); and the digit line DLE4 includes a wiring extension provided by wiring layer 325(4P) and wiring contact 330(4P). Each wiring contact 330 includes a conductive material and couples a wiring layer 325 to a conductive interconnect 315 of the digit line DLE.

In some embodiments of the disclosure, the conductive wiring layers 325 are positioned over the conductive interconnects 315, and coupled to a respective conductive interconnect 315 by a wiring contact 330. For example, the wiring layer 325(1P) is positioned over the conductive interconnect 315(1F) and coupled to the conductive interconnect 315(1F) by the wiring contact 330(1P). In a similar manner, the wiring layer 325(2P) is positioned over the conductive interconnect 315(2F) and coupled to the conductive interconnect 315(2F) by the wiring contact 330(2P); the wiring layer 325(3P) is positioned over the conductive interconnect 315(3F) and coupled to the conductive interconnect 315(3F) by the wiring contact 330(3P); and the wiring layer 325(4P) is positioned over the conductive interconnect 315(4F) and coupled to the conductive interconnect 315(4F) by the wiring contact 330(4P). In some embodiments, the wiring contact 330 is over a contact 320. For example, the wiring contact 330(1P) is over contact 320(1B). In other examples, the wiring contact 330(2P) is over contact 320(2B), the wiring contact 330(3P) is over contact 320(3B), and the wiring contact 330(4P) is over contact 320(4B).

In some embodiments of the disclosure, for example, as shown in FIG. 7, the conductive wiring layer 325 extends in the direction Y over another conductive interconnect 315 of a different digit line. For example, the wiring layer 325(1P) extends over, but is not coupled to the conductive interconnect 315(3F). Similarly, the wiring layer 325(2P) extends over, but is not coupled to the conductive interconnect 315(4F). Likewise, the wiring layer 325(3P) extends over, but is not coupled to the conductive interconnect 315(1F); and the wiring layer 325(4P) extends over, but is not coupled to the conductive interconnect 315(2F).

The conductive wiring layers 325 may include a conductive material. In some embodiments of the disclosure, the conductive wiring layers 325 are formed from a metal material, for example, tungsten. Other conductive materials may be used for the conductive wiring layers 325 as well. The conductive wiring layers 325 may be formed from a layer of conductive material deposited on an insulating layer, and the wiring contacts 330 penetrate the insulating layer to couple to a respective conductive interconnect 315. In some embodiments of the disclosure, the conductive wiring layer 325 may be formed from a first local interconnect layer of a semiconductor structure (e.g., L1 local interconnect layer). In some embodiments of the disclosure, the conductive wiring layer 325 for each of the digit lines DLE1, DLE2, DLE3, and DLE4 have the same dimensions. For example, the conductive wiring layers 325 for the digit lines DLE1, DLE2, DLE3, and DLE4 may have the same lengths in the direction Y and the same widths in the direction X.

Each digit line DLE1, DLE2, DLE3, and DLE4 of the example of FIG. 7 includes first and second conductive lines 310, first and second contacts 320, a conductive interconnect 315, a wiring contact 330, and a conductive wiring layer 325. As a result, a digit line is electrically continuous from one of the conductive lines 310, through the conductive interconnect 315 and contacts 320, to the other conductive line 310, and the digit line includes a wiring extension provided by the wiring contact 330 and the conductive wiring layer 325.

For example, the digit line DLE1 includes conductive lines 310(1A) and 310(1B), contacts 320(1A) and 320(1B), conductive interconnect 315(1F), and a wiring extension DLE1C that includes wiring contact 330(1P) and conductive wiring layer 325(1P). Similarly, the digit line DLE2 includes conductive lines 310(2A) and 310(2B), contacts 320(2A) and 320(2B), conductive interconnect 315(2F), and a wiring extension DLE2C that includes wiring contact 330(2P) and conductive wiring layer 325(2P). Also likewise, the digit line DLE3 includes conductive lines 310(3A) and 310(3B), contacts 320(3A) and 320(3B), conductive interconnect 315(3F), and a wiring extension DLE3C that includes wiring contact 330(3P) and conductive wiring layer 325(3P); and the digit line DLE4 includes conductive lines 310(4A) and 310(4B), contacts 320(4A) and 320(4B), conductive interconnect 315(4F), and a wiring extension DLE4C that includes wiring contact 330(4P) and conductive wiring layer 325(4P).

Figure 8:
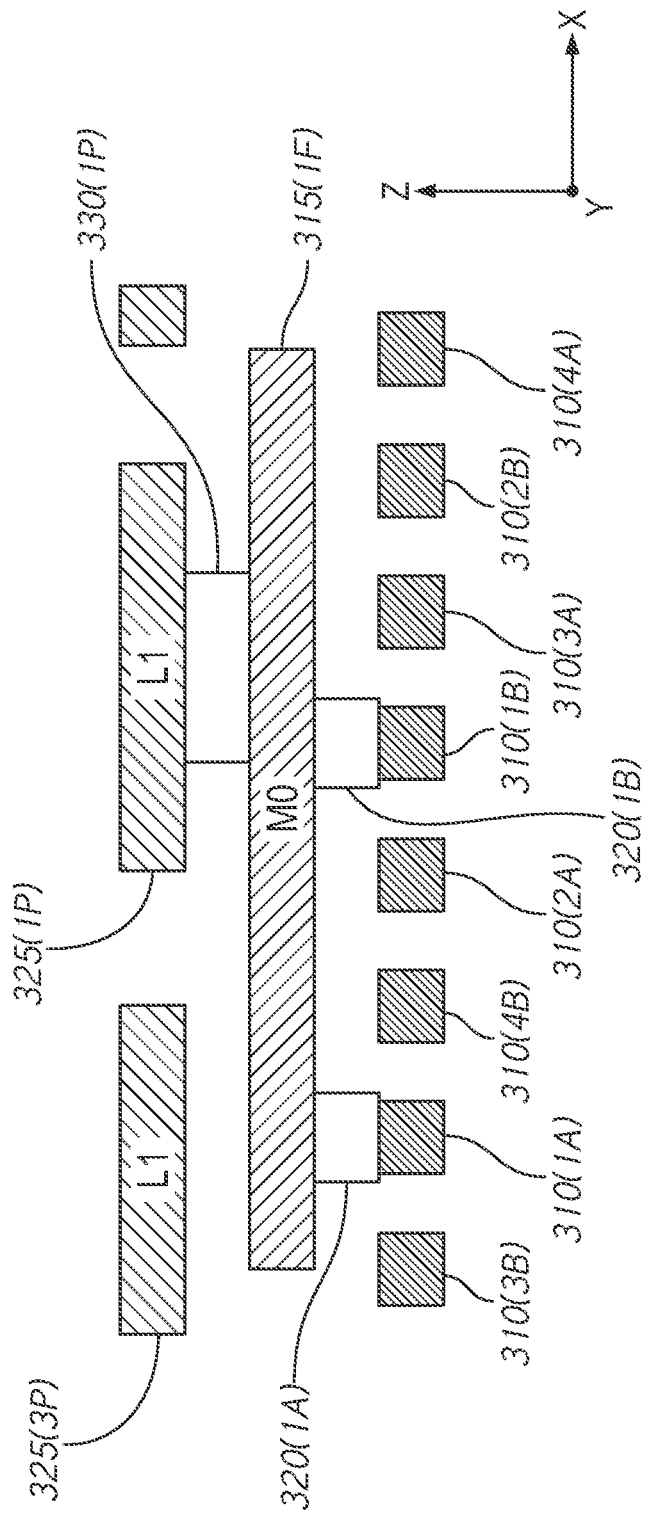
FIG. 8 is a simplified cross-sectional diagram for a digit line of FIG. 7 according to an embodiment of the disclosure.

FIG. 8 is a simplified cross-sectional diagram for a digit line of FIG. 7 according to an embodiment of the disclosure. In particular, FIG. 8 is the cross-sectional diagram for the digit line DLE1 at the cutting plane line shown in FIG. 7. The cutting plane line is along the direction X and the resulting cross-sectional diagram includes, among other things, the conductive lines 310(1A) and 310(1B), the contacts 320(1A) and 320(1B), the conductive interconnect 315(1F), the wiring contact 330(1P), and conductive wiring layer 325(1P).

The conductive lines 310(1A) and 310(1B) of the digit DLE1 line are spaced apart laterally, with one or more conductive lines 310 of one or more different digit lines between them. In particular, the two conductive lines 310 (4B) and 310(2A) of digit lines DLE4 and DLE2, respectively, are between the conductive lines 310(1A) and 310 (1B) of the digit line DLE1. The contact 320(1A) is positioned over and coupled to the conductive line 310(1A) and the contact 320(1B) is positioned over and coupled to the conductive line 310(1B) along direction Z. The conductive interconnect 315(1F) is positioned over and is coupled to the contacts 320(1A) and 320(1B). A continuously conductive digit line DLE1 is provided by the conductive line 310(1A), contact 320(1A), conductive interconnect 315(1F), contact 320(1B), and the conductive line 310(1B). The conductive interconnect 315(1F) extends and crosses over the two conductive lines 310(4B) and 310(2A) of the different digit lines DLE4 and DLE2, all respectively. As a result, the conductive lines 310(1A) and 310(1B) of the digit line DLE1 are not adjacent to each other, and have two conductive lines 310(4B) and 310(2A) of the different digit lines DLE4 and DLE2 between them along the direction X.

The digit line DLE1 includes a wiring extension DLE1C having the wiring contact 330(1P) that is positioned over and coupled to the conductive interconnect 315(1F), which is further coupled to the conductive wiring layer 325(1P) positioned over and coupled to the wiring contact 330(1P). The wiring extension DLE1C increases a wiring capacitance of the digit line DLE1.

As previously described, compared to conventional folded digit lines having adjacent digit line portions, folded digit lines having digit line portions not being adjacent may provide higher capacitance. Thus, the digit line portions of a folded digit line having a folded portion that traverses the digit line portion of at least one different digit line may be relatively shorter compared to the digit line portions of conventional folded digit lines of an edge mat, which may allow for a smaller edge mat. Defect detection may be improved with folded digit lines having digit line portions that are not adjacent because short circuit defects between adjacent folded digit lines may be detected since adjacent digit line portions are from different folded digit lines. As also previously described, including wiring extensions to folded digit lines to increase wiring capacitance may allow for shorter digit line portions of the folded digit lines of an edge mat, and may result in edge mats having a relatively smaller size.

Although not shown, a cross-sectional view for the digit line DLE2 through the contacts 320(2A) and 320(2B) is similar to the cross-sectional view for the digit line DLE1 shown in FIG. 8. That is, the conductive lines 310(2A) and 310(2B) would be coupled together through contacts 320 (2A) and 320(2B), and the conductive interconnect 315(2F). The contacts 320(2A) and 320(2B) are positioned over and coupled to the conductive lines 310(2A) and 310(2B) along the direction Z, respectively, and the conductive interconnect 315(2F) is positioned over and coupled to the contacts 320(2A) and 320(2B). The conductive interconnect 315(2F) extends and crosses over two conductive lines 310(1B) and 310(3A) of the different digit lines DLE1 and DLE3, respectively, with the two conductive lines 310(1B) and 310(3A) positioned between the conductive lines 310(2A) and 310 (2B) of digit line DLE2 along the direction X. A conductive wiring layer 325(2P) is positioned over and coupled to the conductive interconnect 315(2F) by the wiring contact 330 (2P) to increase the wiring capacitance of the digit line DLE2.

Although not shown, a cross-sectional view for the digit line DLE3 through the contacts 320(3A) and 320(3B) is also similar to the cross-sectional view for the digit line DLE1 shown in FIG. 8. That is, the conductive lines 310(3A) and 310(3B) would be coupled together through contacts 320 (3A) and 320(3B), and the conductive interconnect 315(3F). The contacts 320(3A) and 320(3B) are positioned over and coupled to the conductive lines 310(3A) and 310(3B) along the direction Z, respectively, and the conductive interconnect 315(3F) is positioned over and coupled to the contacts 320(3A) and 320(3B). However, unlike the digit line DLE1, the conductive interconnect 315(3F) of digit line DLE3 extends and crosses over four conductive lines 310(1B), 310(2A), 310(4B), and 310(1A) of the different digit lines DLE1, DLE2, and DLE4, with the four conductive lines 310(1B), 310(2A), 310(4B), and 310(1A) positioned between the conductive lines 310(3A) and 310(3B) of digit line DLE3 along the direction X. A conductive wiring layer 325(3P) is positioned over and coupled to the conductive interconnect 315(3F) by the wiring contact 330(3P) to increase the wiring capacitance of the digit line DLE3.

Although not shown, a cross-sectional view for the digit line DLE4 through the contacts 320(4A) and 320(4B) is also similar to the cross-sectional view for the digit line DLE1 shown in FIG. 8. That is, the conductive lines 310(4A) and 310(4B) would be coupled together through contacts 320 (4A) and 320(4B), and the conductive interconnect 315(4F). The contacts 320(4A) and 320(4B) are positioned over and coupled to the conductive lines 310(4A) and 310(4B) along the direction Z, respectively, and the conductive interconnect 315(4F) is positioned over and coupled to the contacts 320(4A) and 320(4B). However, unlike the digit line DLE1, the conductive interconnect 315(4F) of digit line DLE4 extends and crosses over four conductive lines 310(2B), 310(3A), 310(1B), and 310(2A) of the different digit lines DLE2, DLE3, and DLE1, with the four conductive lines 310(2B), 310(3A), 310(1B), and 310(2A) positioned between the conductive lines 310(3A) and 310(3B) of digit line DLE3 along the direction X. A conductive wiring layer 325(4P) is positioned over and coupled to the conductive interconnect 315(4F) by the wiring contact 330(4P) to increase the wiring capacitance of the digit line DLE4.

Figure 9:
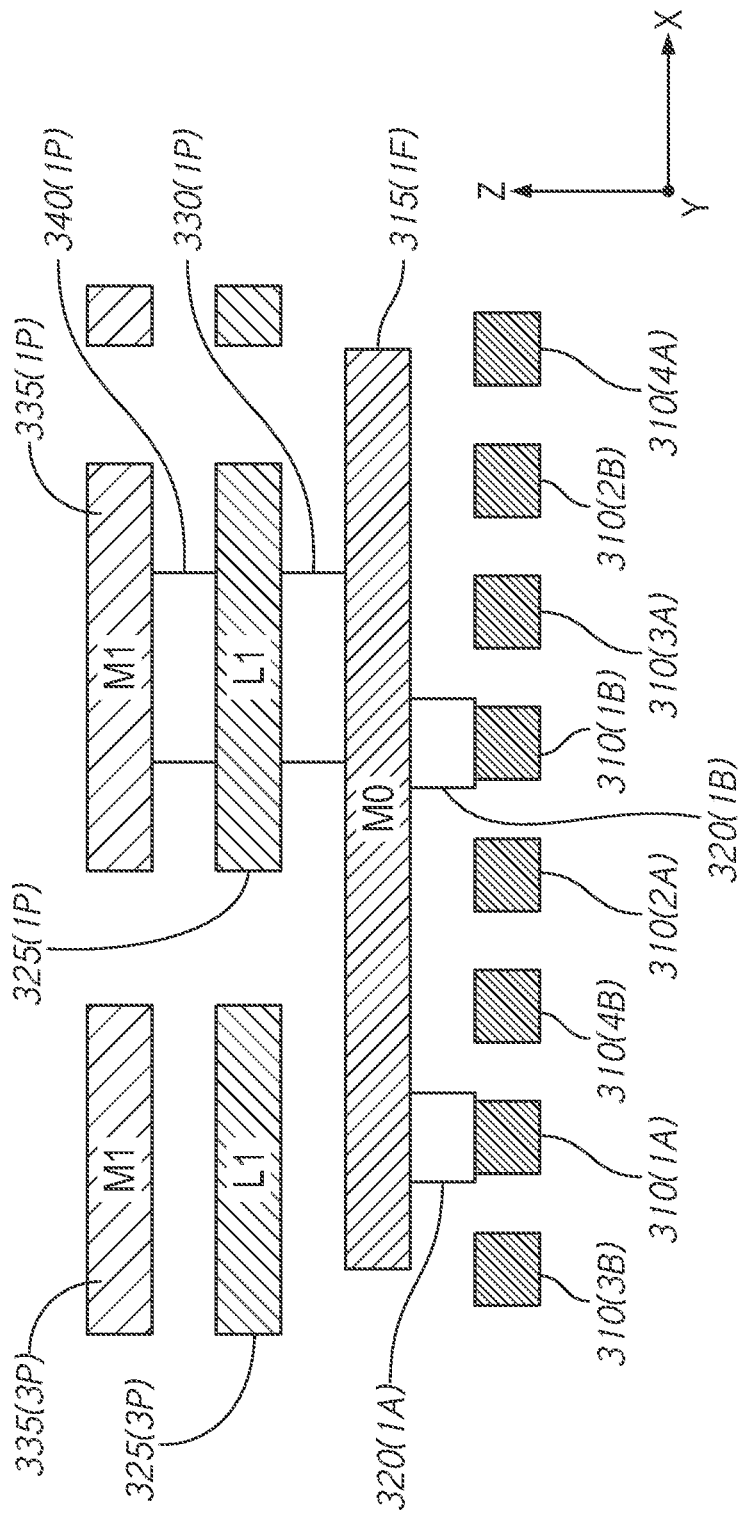
FIG. 9 is a simplified cross-sectional diagram of a folded portion of a digit line according to an embodiment of the disclosure.

FIG. 9 is a simplified cross-sectional diagram of a folded portion of a digit line according to an embodiment of the disclosure. The cross-sectional diagram is similar to the cross-sectional diagram of the example of FIG. 8. However, the digit line of the example of FIG. 9 is coupled to a wiring extension having a different structure than previously described with reference to FIGS. 7 and 8. The cross-sectional diagram includes, among other things, the conductive lines 310(A) and 310(B), the contacts 320(A) and 320(B), the conductive interconnect 315(F), the wiring contact 330(P), and conductive wiring layer 325(P). A conductive wiring layer 335(P) and a wiring contact 340(P) are also included.

The conductive lines 310(A) and 310(B) of the digit DLE line are spaced apart laterally, with one or more conductive lines 310 of one or more different digit lines between them. In particular, the two conductive lines of different digit lines are between the conductive lines 310(A) and 310(B) of the digit line DLE. The contact 320(A) is positioned over and coupled to the conductive line 310(A) and the contact 320(B) is positioned over and coupled to the conductive line 310(B) along direction Z. The conductive interconnect 315 (F) is positioned over and is coupled to the contacts 320(A) and 320(B). A continuously conductive digit line DLE is provided by the conductive line 310(A), contact 320(A), conductive interconnect 315(F), contact 320(B), and the conductive line 310(B). The conductive interconnect 315(F) extends over the two conductive lines of different digit lines. As a result, the conductive lines 310(A) and 310(B) of the digit line DLE are not adjacent to each other, and have two conductive lines of the different digit lines between them along the direction X.

The digit line DLE includes wiring extension DLEC that includes the conductive wiring layer 325(P) and the conductive wiring layer 335(P). The conductive wiring layer 325(P) is coupled by the wiring contact 330(P) and the conductive wiring layer 335(P) is coupled to the conductive wiring layer 325(P) by the wiring contact 340(P). In comparison to the example digit line previously described with reference to FIGS. 7 and 8, the additional conductive wiring layer 335(P) and wiring contact 330(P) may be used to further increase wiring capacitance of the digit line DLE.

The conductive wiring layer 335(P) may include a conductive material. In some embodiments of the disclosure, the conductive wiring layer 335(P) is formed from a metal material, for example, copper. Other conductive materials may be used for the conductive wiring layer 335(P) as well. The conductive wiring layer 335(P) may be formed from a layer of conductive material deposited on an insulating layer through which the wiring contact 340(P) penetrates to couple to a respective conductive wiring layer 325(P). In some embodiments of the disclosure, the conductive wiring layer 335(P) may be formed from a second metal layer of a semiconductor structure (e.g., M1 metal layer).

Although various embodiments of the disclosure have been disclosed, it will be understood by those skilled in the art that the embodiments extend beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
   a first digit line portion extending in a first direction;
   a second digit line portion extending in the first direction;

a third digit line portion between the first and second digit line portions and extending in the first direction; and a folded portion coupled to the first and second digit line portions, the folded portion extending in a second direction and traversing the third digit line portion, wherein a digit line includes the first digit line portion, second digit line portion, and the folded portion, and the digit line is electrically continuous through the first digit line portion, the folded portion, and the second digit line portion.

2. The apparatus of claim 1 wherein the first digit line portion, the second digit line portion, and the folded portion are included in a first digit line and the third digit line portion is included in a second digit line different than the first digit line.

3. The apparatus of claim 2, further comprising a capacitor coupled to the first digit line.

4. The apparatus of claim 1, further comprising a fourth digit line portion extending in the first direction, the fourth digit line portion adjacent the third digit line portion and between the first and second digit line portions, wherein the folded portion further traverses the fourth digit line portion.

5. The apparatus of claim 1, further comprising fourth, fifth, and sixth digit line portions extending in the first direction, the fourth digit line portion adjacent the third digit line portion and the fourth, fifth, and sixth digit line portions between the first and second digit line portions, wherein the folded portion further traverses the fourth, fifth, and sixth digit line portions.

6. The apparatus of claim 1 wherein the first, second, and third digit line portions, and the folded portion are included in an edge mat of a memory array.

7. The apparatus of claim 1 wherein the first digit line portion, second digit line portion, and the third digit line portion comprise conductive lines including conductive material.

8. The apparatus of claim 7 wherein the folded portion comprises a first contact coupled to the first digit line portion, a second contact coupled to the second digit line portion, and a conductive interconnect extending in a second direction and coupled to the first and second contacts.

9. The apparatus of claim 8 wherein the first, second, and third conductive lines comprise polysilicon and wherein the conductive interconnect comprises a conductive material of a metal layer above the polysilicon.

10. An apparatus, comprising:
a first conductive line extending in a first direction;
a second conductive line extending in the first direction;
a third conductive line extending in the first direction;
a first contact coupled to and over the first conductive line;
a second contact coupled to and over the second conductive line; and
a conductive interconnect extending in a second direction and crossing over the third conductive line, and the conductive interconnect coupled to the first and second contacts.

11. The apparatus of claim 10 wherein the first, second, and third conductive lines comprise polysilicon conductive line in a semiconductor substrate.

12. The apparatus of claim 10 wherein the conductive interconnect comprising a metal material of a first metal layer.

13. The apparatus of claim 10, further comprising:
a wiring contact coupled to the conductive interconnect; and
a conductive wiring layer above and coupled to the wiring contact.

14. The apparatus of claim 13, further comprising:
a second wiring contact coupled to the conductive wiring layer, and
a second conductive wiring layer above and coupled to the conductive wiring layer.

15. The apparatus of claim 10, further comprising:
a fourth conductive line extending in the first direction;
a third contact coupled to and over the third conductive line;
a fourth contact coupled to and over the fourth conductive line; and
a second conductive interconnect extending in the second direction and crossing over the second conductive line, and the conductive interconnect coupled to the third and fourth contacts.

16. The apparatus of claim 15 wherein the conductive interconnect and the second conductive interconnect have the same dimensions.

17. An apparatus, comprising:
a folded digit line of an edge mat, the folded digit line including first and second digit line portions that are separated by at least one digit line portion of a different folded digit line of the edge mat:
a first contact coupled to the first digit line portion;
a second contact coupled to the second digit line portion; and
a conductive interconnect coupled to the first and second contacts and extending over the at least one digit line portion of the different folded digit line of the edge mat.

18. The apparatus of claim 17, further comprising:
a wiring contact coupled to the conductive interconnect; and
a conductive wiring layer above and coupled to the wiring contact.

19. The apparatus of claim 18 wherein the wiring contact is above the first contact.

* * * * *